Oct. 17, 1967 G. M. PARSONS ETAL 3,348,148

ELECTRONIC APPARATUS PROVIDING HEAT CONDUCTION MOUNTING AND ELECTRICAL CONNECTIONS FOR POWER TRANSISTORS IN A MOBILE COMMUNICATION DEVICE

Filed May 15, 1964 2 Sheets-Sheet 1

INVENTORS.
George M. Parsons,
William R. Harrer,
By Mueller & Aichele Attys.

INVENTORS.
George M. Parsons,
William R. Harrer,
By Mueller & Aichele Attys.

United States Patent Office 3,348,148
Patented Oct. 17, 1967

3,348,148

ELECTRONIC APPARATUS PROVIDING HEAT CONDUCTION MOUNTING AND ELECTRICAL CONNECTIONS FOR POWER TRANSISTORS IN A MOBILE COMMUNICATION DEVICE

George M. Parsons, Rolling Meadows, and William R. Harrer, Park Ridge, Ill., assignors to Motorola, Inc., Chicago, Ill., a corporation of Illinois Filed May 15, 1964, Ser. No. 367,630
13 Claims. (Cl. 325—15)

This invention relates generally to a two-way communication unit including a receiver and a transmitter providing substantial output power, and more particularly to such a unit which includes only semiconductor amplifying devices with mounting and connecting provisions for the semiconductor devices.

In prior communication equipment, transistors and other semiconductor devices have been used in the receiver and have been used in the low power stages of the transmitter. However, in transmitters for providing substantial power, such as 20 watts or more, the high power stages have used tubes. Although transistors have been constructed which have substantial power handling capabilities, these transistors have not been suitable for operating at frequencies of 25 megacycles or higher at which two-way communication equipment is now used.

In order to provide a transmitter having high power radio frequency output, a plurality of transistors may be connected in parallel. This presents a problem at high frequencies since the coupling impedances must be very low. Therefore if the connections to one transistor are even slightly different from that for another transistor, the impedances involved may be sufficiently different so that the transistors will not carry proportional shares of the load. Since it is desired to operate the transistors at substantially full capacity, if one transistor carries more than its share of the load it will be overloaded and subject to burn out.

It is therefore an object of the present invention to provide a two-way communication unit including a transmitter which provides an output of 20 watts or more, and wherein all amplifying stages of the transmitter and receiver include only semiconductor devices.

Another object of the invention is to provide a two-way communication unit with improved housing and mounting facilities for the transistors thereof for conducting heat therefrom.

Still another object of the invention is to provide a transmitter unit in which a plurality of transistors are connected in parallel to provide the high power output, with an improved mounting and connecting arrangement for the parallel transistors.

A feature of the invention is the provision of a two-way radio unit including a transistorized receiver and a transistorized transmitter, with a heat conducting member for supporting and conducting heat from the high power transistors which serves as a portion of the housing for the unit and has fins for conducting heat therefrom.

Another feature of the invention is the provision of a radio transmitter having only semiconductor amplifying devices and a housing therefor including one vertical wall formed by a heat conducting member having a horizontal ledge extending therefrom into the housing with a surface for supporting a plurality of power transistors thereon, and having fins extending opposite to the ledge on the outside of the housing.

A further feature of the invention is the provision of a power amplifier stage having a plurality of transistors connected in parallel and mounted on a common conducting plate which provides one electrical connection thereto and which conducts heat therefrom, with a pair of terminals extending from each transistor through the mounting plate and connected by first and second conducting plates each of which bridge like terminals of all of the transistors to provide low impedance connections to the terminals.

The invention is illustrated in the drawing wherein.

In practicing the invention, a two-way radio unit is provided in which all of the amplifiers are formed by semiconductor devices. The chassis is provided as a rectangular unit with the receiver at the front and the transmitter and power supply therefor at the rear. A front plate is secured to the chassis which forms the front of the housing, and strips are provided along the sides of the chassis, which also constitute parts of the housing. The rear closure of the unit is a heat conducting member having a ledge extending toward the chassis on which power transistors are mounted and which conducts heat therefrom, and fins extending opposite to the ledge at the rear of the unit. The chassis is adapted to be mounted on a rectangular mounting base, and a top cover cooperates with the chassis and mounting base to completely enclose the unit. The mounting base has a bracket at the rear thereof through which the fins of the heat conducting member extend, and which engages the back end of the top cover. The front plate has a turned in edge surrounding the mounting plate and the top cover, and has a latch for engaging the mounting plate to hold the elements in assembled relation, whereby the unit is completely enclosed. The transmitter includes a plurality of high power transistors which develop substantial heat. The collector electrodes of the transistors, which are connected to the mounting bases thereof, are either connected directly to the ledge of the heat conducting member or are insulated therefrom by a mica layer positioned between the mounting plate and the heat conducting member. The terminals extending from the emitter and base electrodes of the transistors pass through openings in the mounting ledge to engage connections on the opposite side. The power amplifier of the transmitter may include a plurality of high power transistors connected in parallel. To provide low impedance connections so that each transistor carries the same load, the connections to the base and emitter terminals are made through flat plates which are separated from the mounting ledge and from each other by insulating sheets. Connections are made to the plates adjacent the center thereof, so that large area connectors are provided having substantially the same configuration to each base electrode and to each emitter electrode.

Figures 1, 3, 4, 5, 6:
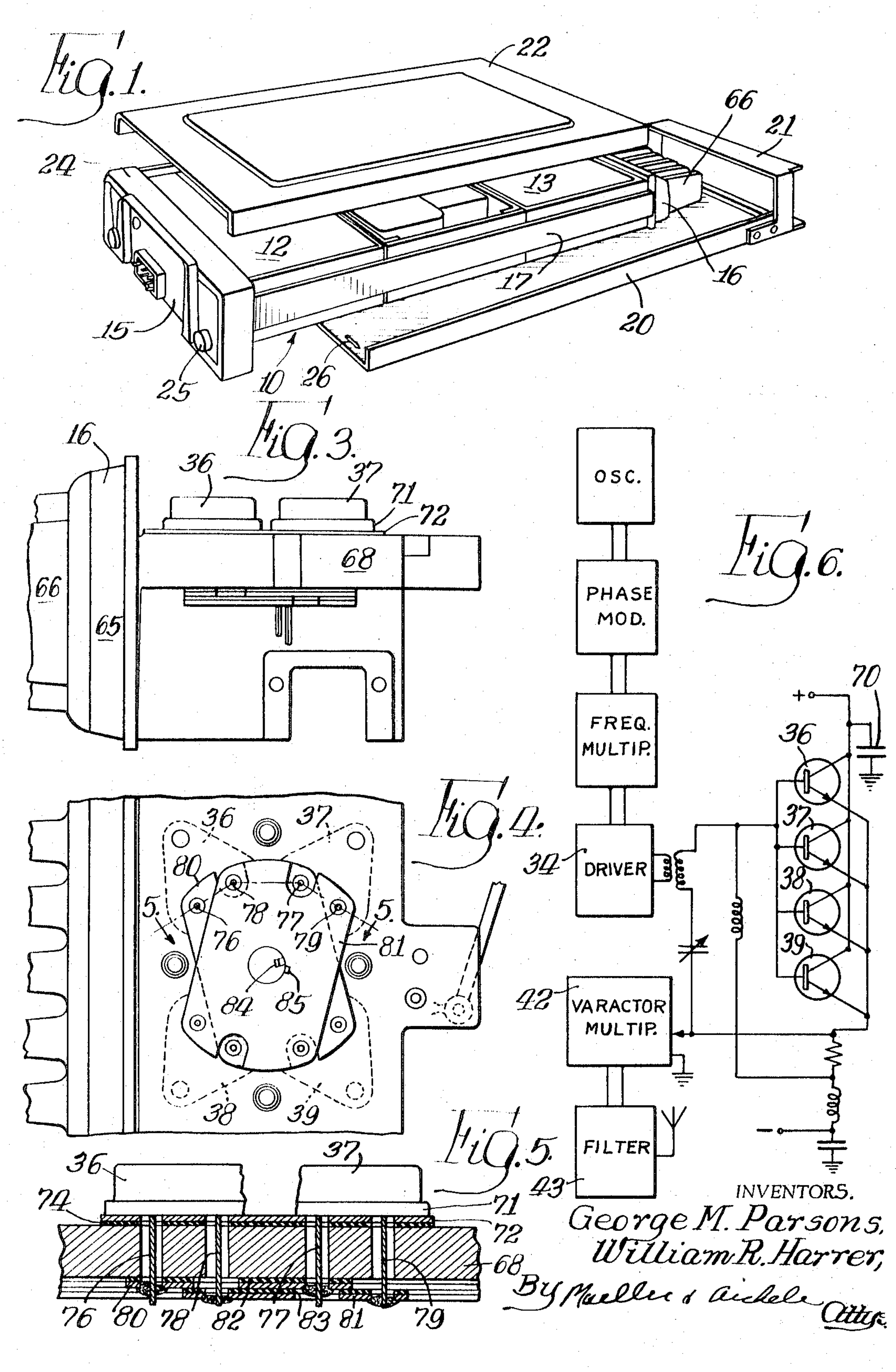
FIG. 1 is an exploded view of the chassis, base plate and top cover which form a complete communication unit.
FIG. 3 shows the heat conducting transistor mounting and back closure for the housing.
FIG. 4 is a bottom view showing the connections of the power amplifier transistors.
FIG. 5 is a cross sectional view along the line 5—5 of FIG. 4.
FIG. 6 is a schematic diagram of the transmitter of the unit of FIG. 1.

Referring now to the drawings, FIG. 1 shows the unit of the invention in exploded form. The chassis 10 includes a receiver 12 at the front thereof and a transmitter 13 at the rear. The front plate 15 is secured to the front of the chassis and a heat conducting member 16 forms the rear closure thereof. Mounting strips 17 are provided along each side of the chassis. The chassis is adapted to be supported on a mounting base 20 which can be secured in a vehicle. The chassis 10 fits on the mounting base like a drawer with the heat conducting member 16 extending through the bracket 21 at the rear of the mounting base. The side strips fit over the upturned edges of the mounting base 20. The top cover plate 22 has downturned edges resting on the side strips 17, and cooperates with the mounting base 20, front plate 15, heat conducting member 16 and mounting strips 17 to form a complete enclosure for the unit. The back end of the cover plate 22 may extend under the bracket 21, and the lip 24 extending back from the front plate 15 surrounds the front ends of the mounting base 20 and of the top plate 22. A latch 25 on the front plate 15, which may be operated by a key, has a movable element adapted to extend into a slot 26 in the mounting base 20 to hold the parts in assembled relation.

Figure 2:
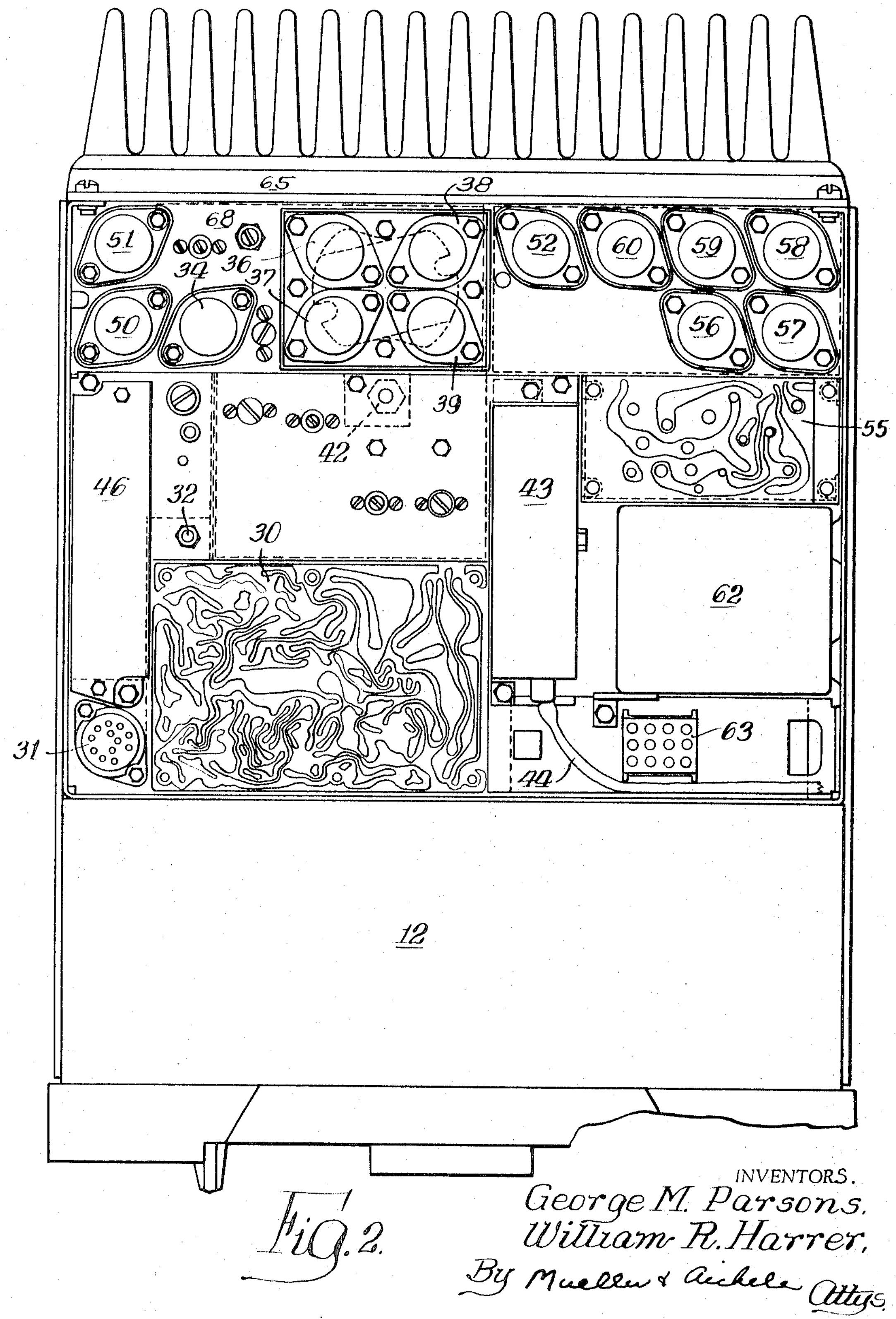
FIG. 2 is a top plan view of the chassis.

Referring now to FIG. 2, this figure shows the general arrangement of the components on the chassis. The receiver 12 is shown only as a box and may be generally similar to the receiver of the system described in Patent No. 3,059,184, issued Oct. 16, 1962, and assigned to the assignee of the present application.

The transmitter and power supply are combined in a single mechanical structure, and the various components will be pointed out. The audio and modulation sections of the transmitter are provided on printed circuit board 30. The board 30 also includes transistors connected in frequency multiplying circuits. Various points on this board are connected to the test socket 31 to facilitate servicing of the unit. The output of the board 30 is applied to an amplifier including medium power transistor 32, and to a driver stage including power transistor 34. The driver stage is coupled to the radio frequency power amplifier stage including power transistors 36, 37, 38 and 39, which are connected in parallel. The output of the power amplifier is applied to a frequency multiplying circuit including varactor 42, and the output from the varactor is applied through harmonic filter 43 and cable 44 to the antenna. The transmitter may include tone oscillators providing selective squelch operation, and these are provided in the box 46.

Additional power transistors are provided to limit the current in the transistors of the transmitter to safe values. Transistor 50 is connected in a circuit to limit the current drawn by medium power transistor 32. Transistor 51 acts to limit the current drawn by driver transistor 34, and transistor 52 is connected to limit the current drawn by the transistors 36 to 39 of the radio frequency power amplifier.

The power supply for the transistors includes the printed circuit board 55 and transistors 56, 57, 58, 59 and 60. These transistors are all relatively high power transistors and they may be connected in any one of a plurality of known circuits. The specific circuit connection is not material to the invention. The power supply also includes power transformer 62 and a connecting arrangement including socket 63 in which a plug may be inserted with a converter so that the system can be used in a vehicle having either the positive or negative terminal of the electrical system grounded.

FIG. 3 illustrates in more detail the heat conducting member 16 of the chassis which forms the rear closure member for the unit. This is constructed of a material having good heat conductivity such as aluminum. This member includes a vertically extending portion 65 from which fins 66 extend rearwardly. Opposite the fins is a ledge 68 which extends horizontally. The power transistors 34, 36 to 39, 50 to 52 and 56 to 60 of the transmitter and power supply are all mounted on the ledge 68, so that the heat therefrom is conducted from the ledge into the vertically extended member 65 and to the fins 66. By providing all high power transistors at the rear of the chassis and mounting the same on the heat conducting member so that heat is radiated from the rear of the chassis, the influence thereof on the remaining components of the chassis is held to a minimum. In particular the transistors in the receiver 12 and on the board 30 of the transmitter are not substantially effected by heat from the power transistors.

As previously stated, the four transistors 36, 37, 38 and 39 forming the power amplifier are connected in parallel. These transistors operate at a relatively high frequency, which may extend above 50 megacycles. The circuit of the transistors is shown in FIG. 6 which illustrates the other elements of the transmitter in block diagram form. The base, collector and emitter electrodes of the four transistors are connected together. As shown in FIG. 6, the collector electrodes are connected through capacitor 70 to ground. In the standard power transistor construction, the collector electrode is connected to the mounting base of the transistor. In FIGS. 3 and 5 the mounting base of the transistors is indicated at 71 and this is connected directly to conducting plate 72. The conducting plate 72 is supported on the ledge 68 but is insulated therefrom by a silver mica sheet 74, which is an effective heat conductor. Accordingly, the plate 72 conducts heat to the heat conducting member 16, and connects the collector electrodes together. The capacitor 70 is formed between the plate 72 and the mounting ledge 68, with the mica sheet 74 forming the dielectric of the capacitor.

As shown in FIG. 5, the conducting terminals for the base and emitter electrodes of the transistors extend through the plate 72, mica sheet 74 and ledge 68 to the bottom side thereof. Terminals 76 and 77 are connected to the base electrodes of transistors 36 and 37, and terminals 78 and 79 are connected to the emitter electrodes of such transistors. The terminals 76 and 77, as well as the terminals connected to the base electrodes of transistors 38 and 39, are connected to plate 80, as by soldering. The terminals 78 and 79, as well as the terminals connected to the emitter electrodes of transistors 38 and 39, are similarly connected to plate 81. Plate 80 is insulated from the ledge 68 by insulating layer 82, and plate 81 is insulated from plate 80 by insulating layer 83.

The construction described is further illustrated in the bottom view of FIG. 4 which shows the configuration of the plates 80 and 81 and the solder connections of the terminals thereto. The common connection to the base electrodes is provided by terminal 84 at the center of plate 80. Accordingly, the distances from the connection 84 to the terminals 76, 77, and to the base electrode terminals of transistors 38 and 39, are all substantially the same, and the connections are all provided by the large area flat plate 80 so that the inductance thereof is a minimum. Similarly, the connection to the emitter electrodes is made through terminal 85 which is near the center of plate 81, so that the connections to the emitter terminals 78 and 79, and to the emitter terminals of transistors 38 and 39, are all of substantially the same distance and are provided by the flat plate 81 to form a minimum of inductance.

The structure described has been found to be a very effective arrangement for a communication unit having a plurality of power transistors which produce substantial heat. The heat conducting member provides a mounting ledge for the transistors which is conveniently located with respect to the other components on the chassis to which they are connected. This member also forms the rear closure for the unit and has fins extending therefrom so that the heat is radiated outside the unit.

The arrangement for connection of a plurality of transistors in parallel provides low impedance connections so that the transistors share the load equally. This is accomplished in a simple and effective mechanical structure. Although these transistors are insulated from the conducting member, effective heat conduction thereto is provided. The overall structure forms a compact package which is of a desired configuration for electronic devices, as two-way communication units.

We claim:

1. A communication unit including in combination, a rectangular chassis including transistors and other electrical components and having a front plate and side strips secured thereto, a rectangular mounting base for supporting said chassis, a top cover plate, said chassis including a heat conducting structure at the rear end thereof having a horizontally extending portion for mounting transistors thereon and a vertically extending portion forming a rear closure, said heat conducting structure having fins extending from said vertically extending portion for conducting heat from transistors mounted on said horizontally extending portion, said mounting base and said top cover plate cooperating with said front plate, said side strips and said heat conducting structure of said chassis to form an enclosure for the communication unit.

2. An electronic device including in combination, a rectangular chassis including transistors and other electrical components and having a front plate and side strips secured thereto, a rectangular mounting base for supporting said chassis, said base having upturned edges at the side thereof and a bracket at the rear thereof, said chassis including a heat conducting structure at the rear thereof having a ledge portion for mounting said transistors thereon and a portion extending perpendicular to said ledge portion and forming a rear closure, said heat conducting structure having fins extending therefrom for conducting heat from said transistors mounted thereon, said mounting base being adapted to receive said chassis with said heat conducting structure engaging said bracket and said fins extending beyond said mounting base and said side strips engaging said upturned edges of said mounting base, a rectangular top cover plate having downturned edges on the sides thereof for engaging said side strips of said chassis and a rear end engaging said bracket, said front plate having a backward extending lip for surrounding the front ends of said mounting base and said cover plate, said mounting base and said top cover plate cooperating with said front plate, said side strips and said heat conducting structure of said chassis to form a housing for the electronic device.

3. An electronic device including in combination, a rectangular chassis including transistors and other electrical components and having a front plate and side strips secured thereto, a rectangular mounting base for supporting said chassis, said base having upturned edges at the sides thereof and a bracket at the rear thereof, said chassis including a heat conducting member at the rear end thereof having a first portion for mounting said transistors thereon and the second portion extending substantially at right angles to said first portion and forming a rear closure, said heat conducting member having fins extending from said second portion thereof for conducting heat from said transistors mounted on said first portion, said mounting base being adapted to receive said chassis with said heat conducting member engaging said bracket and said fins extending beyond said mounting base and said side strips engaging said upturned edges of said mounting base, a rectangular top cover plate having downturned edges engaging said side strips of said chassis and a rear end engaging said bracket, said front plate having a backward extending lip for surrounding the front ends of said mounting base and said cover plate, said mounting base and said top cover plate cooperating with said front plate, said side strips and said heat conducting member of said chassis to form a housing for the electronic device, said front plate having a latch with a movable element and said mounting base having a slot for receiving said movable element to hold said chassis and said top cover in assembled relation on said mounting base.

4. A communication unit including in combination, a rectangular chassis having a receiver portion at the front thereof and a transmitter portion at the rear thereof, said transmitter portion including a plurality of power transistors with at least first and second power transistors connected in parallel, said chassis including a heat and electrical conducting member at the rear thereof having a horizontally extending ledge portion for mounting said power transistors thereon and a vertically extending portion forming a rear closure, said first and second transistors each including a collector electrode connected to a mounting portion thereof and base and emitter electrodes and conductors connected thereto and extending from said mounting portion, a first conducting plate supporting said mounting portions of said first and second transistors and connected to said collector electrodes thereof, an insulating sheet supporting said conducting plate on said ledge portion and forming a capacitor between said conducting plate and said heat conducting member, said conducting plate, said insulating sheet and said ledge portion having openings therein through which said conductors extend, a second flat conducting plate connected to said conductors connected to said base electrodes of said first and second transistors and a third flat conducting plate connected to said conductors connected to said emitter electrodes of said first and second transistors, a front plate and side strips secured to said chassis, a rectangular mounting base for supporting said chassis, a top cover plate, said heat conducting member having fins extending from said vertically extending portion for conducting heat from transistors mounted on said horizontally extending portion, said mounting base and said top cover plate cooperating with said front plate, said side strips and said heat conducting member of said chassis to form an enclosure for the communication unit.

5. An electronic device including in combination, a rectangular chassis including a plurality of power transistors with first, second, third and fourth transistors connected in parallel, said chassis including a heat and electrical conducting member at the rear thereof having a horizontally extending ledge portion for mounting said power transistors thereon and a vertically extending portion forming a rear closure, said heat conducting member having fins extending from said vertically extending portion for conducting heat from said transistors mounted on said horizontally extending portion, said first, second, third and fourth transistors each including a collector electrode connected to a mounting portion thereof and base and emitter electrodes and conductors connected thereto and extending from said mounting portion, a first conducting plate supporting said mounting portions of said first, second, third and fourth transistors and connected to said collector electrodes thereof, a mica sheet supporting said conducting plate on said ledge portion and forming a capacitor between said conducting plate and said heat conducting member and conducting heat from said conducting plate to said heat conducting member, said conducting plate, said mica sheet and said ledge portion having openings therein through which said conductors extend, a second flat conducting plate connected to said conductors connected to said base electrodes of said first, second, third and fourth transistors, a third flat conducting plate connected to said conductors connected to said emitter electrodes of said first, second, third and fourth transistors, a front plate and side strips secured to said chassis, a rectangular mounting base for supporting said chassis, and a top cover plate, said mounting base and said top cover plate cooperating with said front plate, said side strips and said heat conducting member of said chassis to form an enclosure for the electronic device.

6. A communication unit including in combination, a rectangular chassis having a receiver portion and a transmitter portion which includes a power supply, said transmitter portion including a plurality of power transistors with first, second, third and fourth transistors being connected in parallel to form a radio frequency power amplifier, said chassis including a heat and electrical conducting member at the rear thereof having a horizontally extending ledge portion for mounting said power transistors thereon and a vertically extending portion forming a rear closure, said heat conducting member having fins extending from said vertically extending portion for conducting heat from transistors mounted on said horizontally extending portion, said first, second, third and fourth transistors each including a collector electrode connected to a mounting portion thereof and base and emitter electrodes and conductors connected thereto and and extending from said mounting portion, a first conducting plate supporting said mounting portions of said first, second, third and fourth transistors and connected to said collector electrodes thereof, a silver mica sheet supporting said conducting plate on said ledge portion and forming a capacitor between said conducting plate and said heat conducting member, and conducting heat from said conducting plate to said heat conducting member, said conducting plate, said mica sheet and said ledge portion having openings therein through which said conductors extend, a second flat conducting plate connected to said conductors connected to said base electrodes of said first, second, third and fourth transistors, a third flat conducting plate insulated from said second plate and connected to said conductors connected to said emitter electrodes of said first, second, third and fourth transistors, a front plate and side strips secured to said chassis, a rectangular mounting base for supporting said chassis, and a top cover plate, said mounting base and said top cover plate cooperating with said front plate, said side strips and said heat conducting member of said chassis to form an enclosure for the electronic device.

7. An electronic device including in combination, a chassis including a plurality of power transistors with at least first and second power transistors connected in parallel, said chassis including a heat and electrical conducting member at the rear end thereof having a ledge portion for mounting said power transistors thereon, said first and second transistors each including a collector electrode connected to a mounting portion thereof and base and emitter electrodes and conductors connected thereto and extending from said mounting portion, a first conducting plate supporting said mounting portions of said first and second transistors and connected to said collector electrodes thereof, a dielectric sheet supporting said conducting plate on said ledge portion and forming a capacitor between said first conducting plate and said heat conducting member, said conducting plate, said dielectric sheet and said ledge portion having openings therein through which said conductors extend, a second conducting plate connected to said conductors connected to said base electrodes of said first and second transistors, a third conducting plate connected to said conductors connected to said emitter electrodes of said first and second transistors, and insulating means insulating said second and third conducting plates from said ledge portion and from each other.

8. An electronic device including in combination, a chassis including a plurality of power transistors with at least first and second power transistors connected in parallel, said chassis including a heat conducting member at the rear thereof having a portion for supporting said power transistors thereon, said first and second transistors each including a collector electrode connected to a mounting portion thereof and base and emitter electrodes and conductors connected thereto and extending from said mounting portion, means supporting said mounting portions of said first and second transistors on said supporting portion of said heat conducting member for conducting heat thereto, said supporting portion having openings therein through which said conductors extend, a first flat conducting plate connected to said conductors connected to said base electrodes of said first and second transistors, and a second flat conducting plate connected to said conductors connected to said emitter electrodes of said first and second transistors.

9. An electronic device including in combination, a chassis including a plurality of power transistors with at least first and second power transistors connected in parallel, said chassis including a heat conducting member at the rear thereof having a body with heat radiating fins extending from one side thereof and a ledge portion extending from the opposite side for supporting said power transistors thereon, said first and second transistors each including a collector electrode connected to a mounting portion thereof and base and emitter electrodes and conductors connected thereto and extending from said mounting portion, means supporting said mounting portions of said first and second transistors on said ledge portion of said heat conducting member for conducting heat thereto, said ledge portion having openings therein through which said conductors extend, a first flat conducting plate connected to said conductors connected to said base electrodes of said first and second transistors, and a second flat conducting plate connected to said conductors connected to said emitter electrodes of said first and second transistors.

10. An electronic device including in combination, a rectangular chassis including a plurality of sections mechanically interconnected to form a unit, said chassis having transistors and other electrical components mounted thereon and interconnected in a circuit, a front plate secured to said chassis, side strips secured on opposite sides of said chassis and having ends extending adjacent said front plate, a rectangular base plate for supporting said chassis and including a rear bracket portion, said chassis having a heat conducting structure at the rear end thereof with a first portion for supporting transistors thereon a second portion forming a rear closure and heat radiating fins extending from said second portion, said first portion extending substantially perpendicular to said second portion, said second portion of said structure cooperating with said bracket of said base plate to hold said chassis on said base plate, a rectangular top cover for said chassis having a rear end engaging said bracket portion of said base plate, said front plate engaging the front ends of said top cover and said base plate, whereby said base plate, said front plate, said side strips and said top cover are held in assembled relation with said chassis.

11. An electronic device including in combination, a rectangular chassis including transistors and other electrical components, a front plate and side strips secured to said chassis, a rectangular mounting base for supporting said chassis, said base having upturned edges at the sides thereof and a bracket at the rear thereof, said chassis including a heat conducting structure at the rear thereof having a shelf portion for mounting said transistors thereon, a closure portion, and heat radiating fins extending from said closure portion for conducting heat from said transistors mounted on said shelf portion, said shelf portion extending substantially at a right angle to said closure portion, said mounting base being adapted to receive said chassis with said closure portion of said heat conducting structure engaging said bracket and said fins extending beyond said mounting base and with said side strips engaging said upturned edges of said mounting base, a rectangular top cover plate having downturned edges on the sides thereof for engaging said side strips of said chassis and a rear end engaging said bracket, said front plate having a backward extending lip for surrounding the front ends of said mounting base and said cover plate, said mounting base and said top cover plate cooperating with said front plate, said side strips and said second portion of said heat conducting member of said chassis to form a housing for the electronic device.

12. An electronic device including in combination, a chassis including a plurality of power transistors with at least first and second power transistors connected in parallel, said chassis including a heat and electrical conducting structure at the rear end thereof having a ledge portion for mounting said power transistors thereon, said first and second transistors each including a first electrode connected to a mounting portion thereof and second and third electrodes and conductors connected thereto, a first conducting plate supporting said mounting portions of said first and second transistors and connected to said first electrodes thereof, a dielectric sheet supporting said conducting plate on said ledge portion and forming a capacitor between said first conducting plate and said heat conducting member, a second conducting plate connected to said conductors connected to said second electrodes of said first and second transistors, and a third conducting plate connected to said conductors connected to said third electrodes of said first and second transistors, said second and third conducting plates being insulated from said ledge portion and from each other.

13. An electronic device including in combination, a chassis including a plurality of power transistors with at least first and second power transistors connected in parallel, said chassis including a heat conducting structure at the rear thereof having a body with heat radiating fins extending from one side thereof and a ledge portion extending from the opposite side for supporting said power transistors thereon, said first and second transistors each including a control electrode and first and second output electrodes, and a mounting portion connected to said first output electrode and conductors connected to said control electrode and to said second output electrode, means supporting said mounting portions of said first and second transistors on said ledge portion of said heat conducting member for conducting heat thereto, a first conducting plate connected to said conductors connected to said control electrodes of said first and second transistors, and a second conducting plate connected to said conductors connected to said second output electrodes of said first and second transistors.

References Cited

UNITED STATES PATENTS

| | | | |
|---|---|---|---|
| 2,731,555 | 1/1956 | Beck | 325—353 X |
| 2,984,774 | 5/1961 | Race. | |
| 3,059,184 | 10/1962 | Germain | 325—352 X |

JOHN W. CALDWELL, *Acting Primary Examiner.*